United States Patent
Hsu et al.

(10) Patent No.: US 8,386,976 B2
(45) Date of Patent: Feb. 26, 2013

(54) METHOD FOR PRODUCING LAYOUT OF SEMICONDUCTOR INTEGRATED CIRCUIT WITH RADIO FREQUENCY DEVICES

(75) Inventors: Tsun-Lai Hsu, Hsinchu Hsien (TW); Jui-Fang Chen, Taichung County (TW); Jun-Hong Ou, Taipei (TW); Ji-Wei Hsu, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 61 days.

(21) Appl. No.: 12/945,122

(22) Filed: Nov. 12, 2010

(65) Prior Publication Data

US 2011/0061031 A1  Mar. 10, 2011

Related U.S. Application Data

(63) Continuation-in-part of application No. 11/675,409, filed on Feb. 15, 2007, now abandoned.

(51) Int. Cl.
*G06F 17/50* (2006.01)
(52) U.S. Cl. ........................................................ 716/110
(58) Field of Classification Search .................. 716/100, 716/110
See application file for complete search history.

(56) References Cited

U.S. PATENT DOCUMENTS

| | | | | |
|---|---|---|---|---|
| 5,212,652 A * | 5/1993 | Agrawal et al. | 326/41 |
| 5,212,653 A | 5/1993 | Tanaka | 364/491 |
| 6,086,617 A * | 7/2000 | Waldon et al. | 703/2 |
| 6,480,137 B2 * | 11/2002 | Kulkarni et al. | 341/172 |
| 6,560,567 B1 * | 5/2003 | Yechuri | 703/2 |
| 7,043,711 B2 * | 5/2006 | Beckman et al. | 716/122 |
| 8,103,987 B2 * | 1/2012 | Banerjee et al. | 716/100 |
| 2004/0003364 A1 * | 1/2004 | Beckman et al. | 716/9 |
| 2006/0190863 A1 * | 8/2006 | Axelrad et al. | 716/4 |
| 2007/0100591 A1 * | 5/2007 | Harazaki | 703/2 |
| 2007/0198204 A1 * | 8/2007 | Levi | 702/117 |
| 2007/0260350 A1 * | 11/2007 | Zagrebnov | 700/121 |
| 2008/0183312 A1 * | 7/2008 | Funk et al. | 700/45 |
| 2008/0222580 A1 * | 9/2008 | Banerjee et al. | 716/4 |
| 2008/0295061 A1 * | 11/2008 | Eisenmann et al. | 716/21 |
| 2010/0121474 A1 * | 5/2010 | Bomholt et al. | 700/104 |
| 2012/0123748 A1 * | 5/2012 | Aben et al. | 703/2 |

* cited by examiner

*Primary Examiner* — Suchin Parihar
(74) *Attorney, Agent, or Firm* — J.C. Patents

(57) ABSTRACT

A method for producing a layout of a device in an integrated circuit before actually fabricated is provided. The method includes inputting at least one fixed parameter for the device for fabrication. And then, a first part of a set of variable parameters of a layout of the device is input. The complete set of the variable parameters is generated. It is checked whether or not the layout with the parameters is satisfying a requirement, wherein an end step is reached if the layout is accepted by the requirement, and a new part of the set of variable parameters as the first part being looping in the foregoing steps if the layout is not accepted by the requirement.

7 Claims, 7 Drawing Sheets

METHOD FOR PRODUCING LAYOUT OF SEMICONDUCTOR INTEGRATED CIRCUIT WITH RADIO FREQUENCY DEVICES

CROSS-REFERENCE TO RELATED APPLICATION

This is a continuation-in-part application of and claims the priority benefit of patent application Ser. No. 11/675,409, filed on Feb. 15, 2007. The entirety of the above-mentioned patent application is hereby incorporated by reference herein and made a part of this specification.

BACKGROUND OF THE INVENTION

1. Field of the Invention

The present invention relates to a method for producing a layout of an integrated circuit (IC), and more particularly to a method for producing a layout of an integrated circuit (IC) with radio frequency (RF) devices.

2. Description of Related Art

An IC layout plays an important role in producing an integrated circuit. With the demand of reducing an IC size, it is significant to dispose most devices in a limited area and meet required specifications. However, due to the above concern of the optimization of the area, most IC layout designers at the current stage do not take the IC layout design into consideration as the RF devices e.g. a capacitor, an inductor, and a varactor are included in the IC chip.

Taking a capacitor for example, designing with a pre-simulation or a post-simulation takes too much time. If the required specifications are not satisfied, a re-design or a change of the layout design is necessary. However, from the viewpoint of efficiency and smart layout design, either the redesign or the change of the layout design is undesired.

Therefore, what is urgently needed is to develop a method, which is efficient, time-saving, and meets the required specification of designers, for producing a layout of an IC with RF devices.

In addition, taking a transformer as another example, the layout design for the transformer is based on an electromagnetic (EM) simulation. However, the EM simulation is generally taking a lot of time. Therefore, it is a good way to easily find an exact solution in short time to design the transformer layer based on the EM simulation. As a result, what is urgently needed is to develop a method, which is efficient, time-saving, and meets the required specification of designers, for creating a wide transformer library to quickly find the solution.

SUMMARY OF THE INVENTION

In view of the above, the present invention is to provide an efficient and time-saving method for producing a layout of an IC with RF devices.

The present invention provides a method for producing a layout of a device in an integrated circuit before actually fabricated. The method includes inputting at least one fixed parameter for the device for fabrication. And then, a first part of a set of variable parameters of a layout of the device is input. The complete set of the variable parameters is generated. It is checked whether or not the layout with the parameters is satisfying a requirement, wherein an end step is reached if the layout is accepted by the requirement, and a new part of the set of variable parameters as the first part being looping in the foregoing steps if the layout is not accepted by the requirement.

In order to the make the aforementioned and other objects, features and advantages of the present invention comprehensible, a preferred embodiment accompanied with figures are described in detail below.

BRIEF DESCRIPTION OF THE DRAWINGS

FIGS. 3A and 3B are examples of FIG. 2, wherein FIG. 3A is a top view illustrating a capacitor, and FIG. 3B is a diagram depicting a frequency response of the capacitor.

FIGS. 5A and 5B are examples of FIG. 4, wherein FIG. 5A is a top view illustrating a spiral-like inductor device, and FIG. 5B is a diagram depicting a frequency response of the spiral-like inductor device.

DESCRIPTION OF EMBODIMENTS

Figure 1:
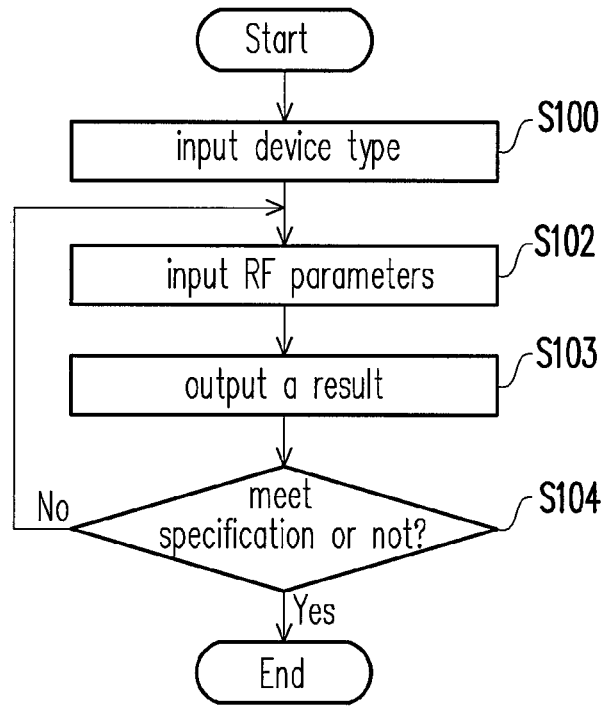
FIG. 1 is a schematic flow chart showing a layout method according to the embodiment of the present invention.

FIG. 1 is a schematic flow chart showing a layout method according to the embodiment of the present invention. First, in step S100, type information of at least one device is inputted. The device can be a capacitor device, an inductor device, a varactor device, a transformer device, or resistor and a transistor working under RF range. As for the type information of a device, the type information of the capacitor device can be stacked type information of multiple metal layers. The type information of an inductor device can be a shape of the inductor.

In step S102, after a device and required type information are inputted, at least one RF parameter corresponding to the device is inputted. The RF parameter can be an operating frequency and a corresponding Q factor. Besides, considering a frequency response of the device under the radio frequency, a value of the device itself is quite important. For example, a capacitance, an inductance, a resistance are required to be inputted. Next, in step S103, a frequency response result is generated according to the RF parameter and the type information of the device. The frequency response result mainly concerns the relation of the device value vs. the frequency and of the Q factor vs. the frequency. If the frequency response result meets the requirements, designers are capable of knowing whether the previously inputted RF parameter meets the requirements of layout design. With the results, it is convenient for designers to design or modify an IC layout.

In step S104, when the frequency response result meets the required specifications, designers can design an IC layout based on the result, so as to make the ultimate IC layout work in the best condition of an operating frequency and a Q factor. However, when the frequency response result does not meet the required specification, the design process returns to step S102 to input a RF parameter and a geometric parameter again.

From the above, the main point of the embodiment is that through inputting a RF parameter, a layout design concerns not only the geometric aspects such as an area and a layout disposition, but also the condition under an RF operation. Next, various RF devices are used as different embodiments to further explain the description of the embodiments of the present invention.

Figure 2:
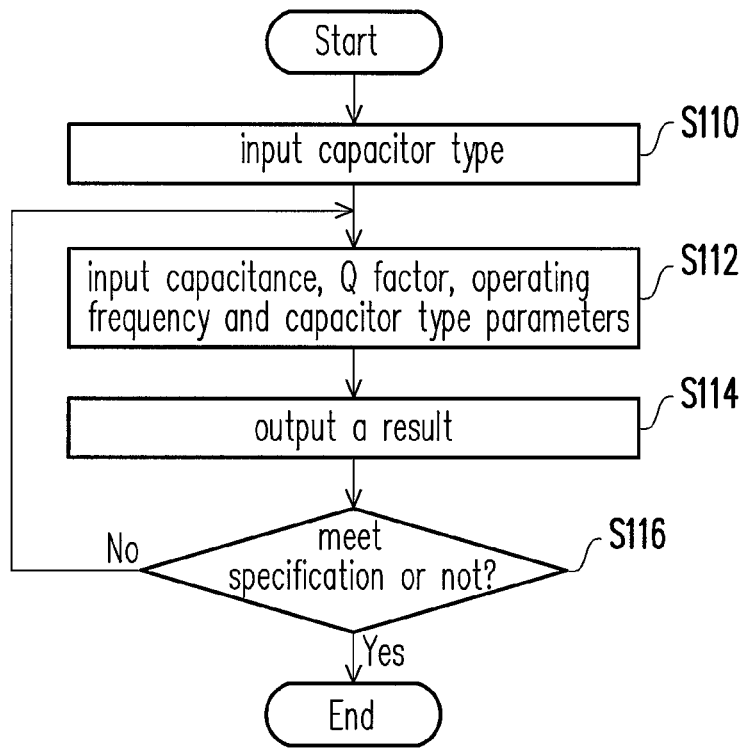
FIG. 2 is a schematic flow chart showing a layout method according to a capacitor device as the embodiment of the present invention.

FIG. 2 is a schematic flow chart showing a layout method according to a capacitor device as the embodiment of the present invention. In step S110, the type information of the capacitor device is inputted by designers. For example, the type information can be a shape of the capacitor, a stack type of a metal layers, and a number of the stacked type of the aforesaid metal layers. That is, the required geometric structure of the capacitor in an IC design should be confirmed in the beginning. For example, a largest number of the stacked metal layers inputted by designers should be confirmed first.

Next, in step S112, RF parameters of the capacitor device are inputted, such as a capacitance, an operating frequency, a corresponding Q factor, and an area limitation. Besides, information of a bottom electrode and a top electrode of the capacitor, a largest number of the connected capacitors, a length and a width of an area, a finger number of the electrode and a length and a width of the finger are inputted. Thus, the system can proceed with calculations based on the inputted type information of the capacitor and the RF parameters to obtain a corresponding frequency response result.

The frequency response result can be, for example, the capacitance in response to the operating frequency and the Q factor in response to the operating frequency. Next, in step S114, the frequency response result is outputted for the designers. Accordingly, the designers can determine whether the inputted parameter satisfies the requirements of the IC layout and meets the required specifications.

In step S116, when the outputted result in step S114 meets the required specification, the aforesaid process is finished. On the other hand, if the outputted result in step S114 does not meet the required specification, the process will return to step S112 to input a new RF parameter and perform the aforesaid process again until a result meeting the required specification is obtained.

Figure 3A:
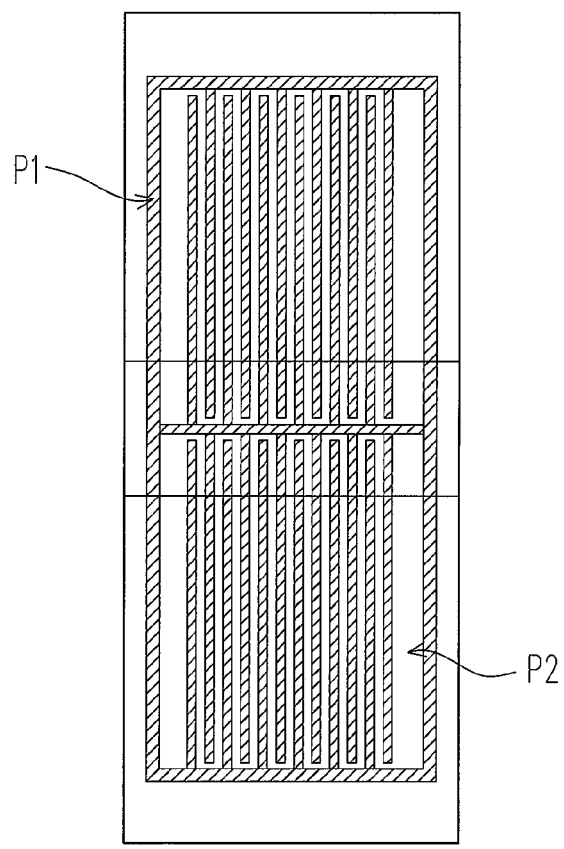
Figure 3B:
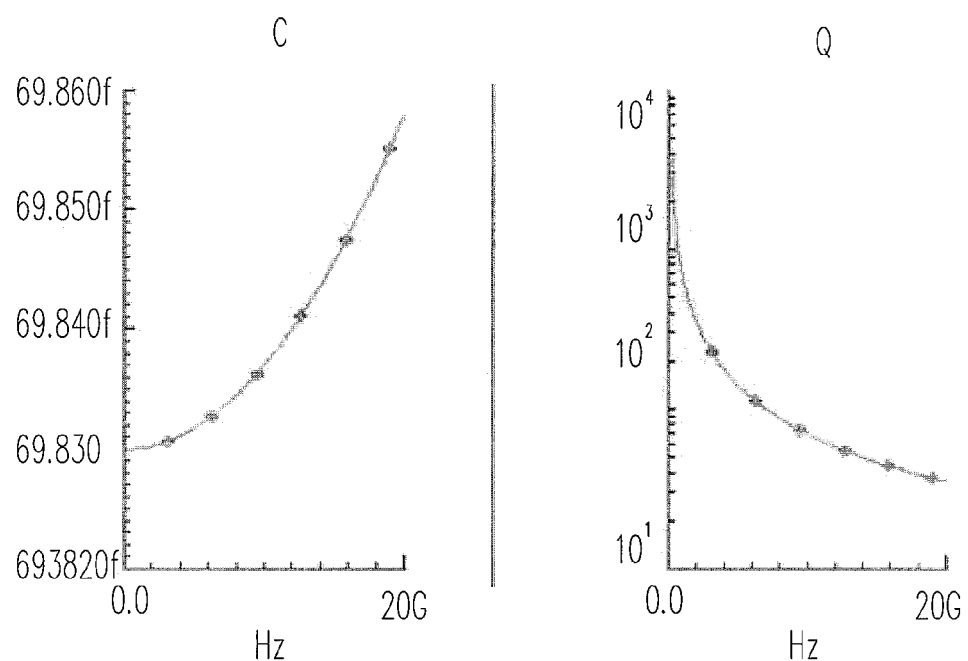

FIGS. 3A and 3B are examples of FIG. 2, wherein FIG. 3A is a top view illustrating a capacitor, and FIG. 3B is a diagram depicting a frequency response of the capacitor. In the embodiment, some geometric parameters regarding the capacitor are inputted. For example, the finger number is 12, the finger length is 5 μm, the bottom layer number is 1, the top layer number is 6, and the number of parallel-connected capacitors is 2. Next, a characteristic parameter of the capacitor is inputted. For example, the capacitance is 69.83 fF, the operating frequency Freq is 5 GHz, and the Q factor is 140.

After the process of inputting, the system performs the calculation process and a result is outputted. For example, in FIG. 3A, the capacitor structure comprises two capacitors connected in parallel each having 12 fingers. In FIG. 3B, the frequency response diagrams of capacitance vs. frequency (C vs. Freq) and Q factor vs. frequency (Q vs. Freq) are respectively shown. The result can help determine whether the required specifications are satisfied. If the result does not meet the required specifications, the parameters can be changed in the process of FIG. 3 to input parameters and perform the process again.

Figure 4:
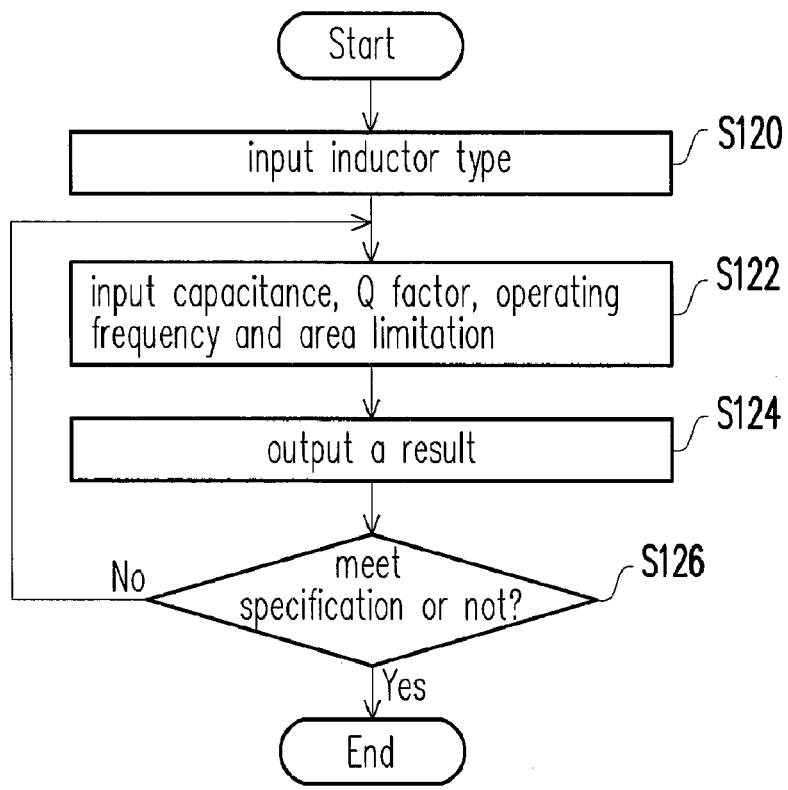
FIG. 4 is a schematic flow chart showing a layout method according to an inductor device as the embodiment of the present invention.

FIG. 4 is a schematic flow chart showing a layout method according to an inductor device as the embodiment of the present invention. In step S120, type information of the inductor is inputted by designers. For example, a shape of the inductor can be spiral, winding, saw-tooth, and square voltage shape. Whether the shape of the inductor is symmetric or whether the inductor is a stacked structure are taken into consideration. That is, the required geometric structure of the inductor in an IC design should be confirmed in the beginning.

Next, in step S122, RF parameters of the inductor device are inputted, such as an inductance, an operating frequency, a corresponding Q factor, and an area limitation. Thus, the system can proceed with calculation based on the inputted type information of the inductor and the RF parameters to obtain a corresponding frequency response result.

The frequency response result can be, for example, the inductance in response to the operating frequency and the Q factor in response to the operating frequency. Next, in S124, the frequency response result is outputted for the designers. Accordingly, the designers can determine whether the inputted parameter satisfies the requirements of an IC layout and meets the required specifications.

In step S126, when the outputted result in step S124 meets the required specifications, the aforesaid process is finished. On the other hand, if the outputted result in step S124 does not meet the required specifications, the process will return to step S122 to input new RF parameters and perform the aforesaid process again until a result meeting the required specifications is obtained.

Figure 5A:
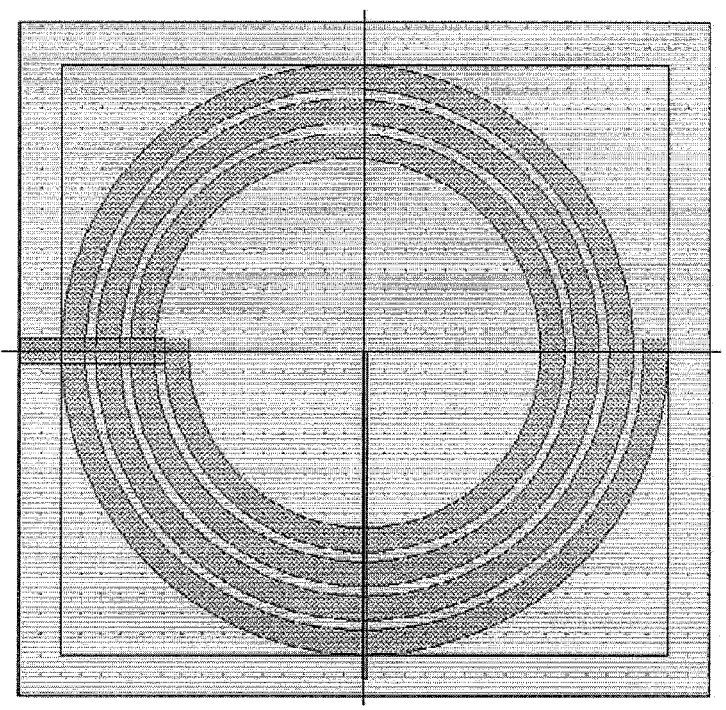
Figure 5B:
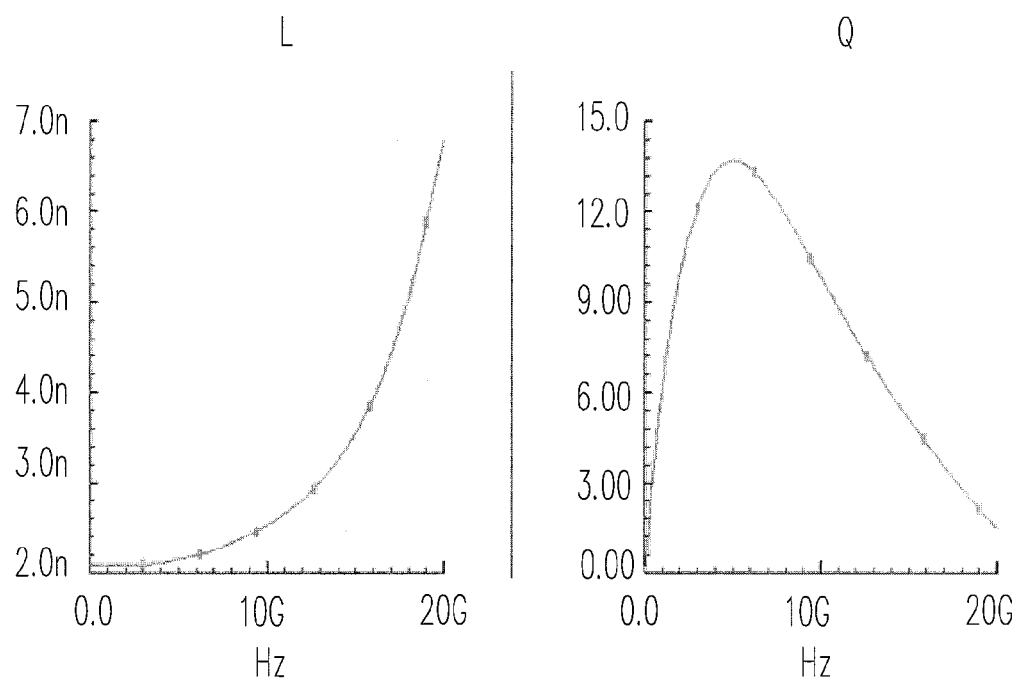

FIGS. 5A and 5B are examples of FIG. 4, wherein FIG. 4A is a top view illustrating an inductor device, and FIG. 4B is a diagram depicting a frequency response of the inductor device. In the embodiment, some geometric parameters regarding the inductor device are inputted first, such as shape, symmetric type or stacked type. Next, characteristic parameters of the inductor are inputted, such as an inductance of 2.14 nH, an operating frequency Freq of 5 GHz, and a Q factor.

After the process of inputting, the system performs the calculation process and a result is outputted. For example, in FIG. 5A, the inductor structure is a symmetric spiral shape. In FIG. 5B, the frequency response diagrams of inductance vs. frequency (L vs. Freq) and Q factor vs. frequency (Q vs. Freq) are respectively shown. The outputted result can help determine whether the required specifications are satisfied. If the result does not meet the required specifications, the parameter is changed in the process of FIG. 4 to input a parameter and perform the process again.

Figure 6:
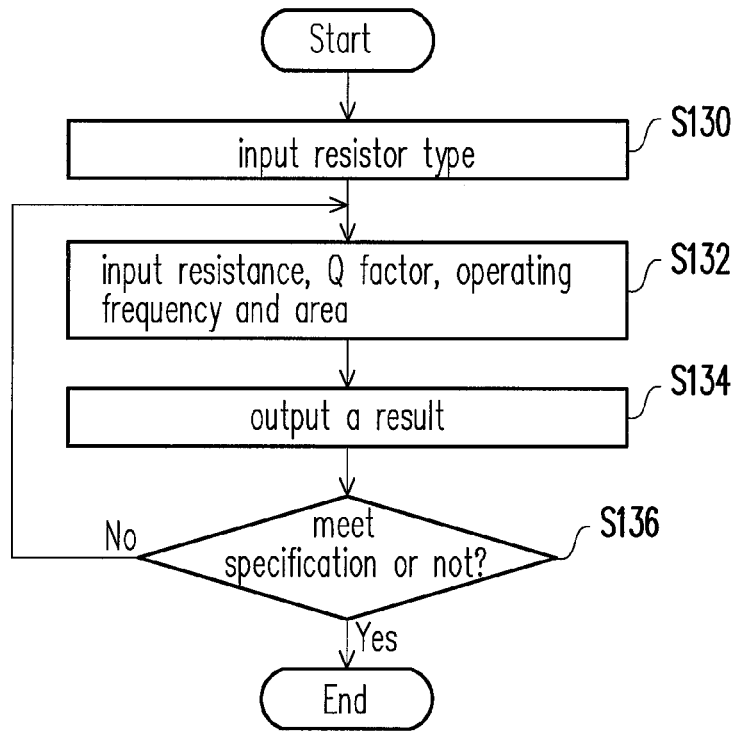
FIG. 6 is a schematic flow chart showing a layout method according to a resistor device as the embodiment of the present invention.

FIG. 6 is a schematic flow chart showing a layout method according to a resistor device as the embodiment of the present invention. Basically, the resistor does not belong to an RF device. But, the resistor is usually put together with a capacitor and/or an inductor to form an RC, RL, or RLC circuit. Accordingly, when designing a layout of the resistor, not only an area and an arrangement should be taken into consideration, but an effect of a particular operating frequency should be concerned.

In step S130, when designers input type information of the resistor, the type information can be type information of a doped region and a diffusion region. For example, an N-type doped polysilicon, a doped polysilicon, a high-resistance polysilicon, or an N-type diffusion region are inputted. Through the above information, the parameters concerning a position and a size of the resistor can be confirmed. In step S132, an operating frequency, a resistance under the operating frequency, and an area limitation are further inputted by the designers. Through the aforementioned two steps, a corresponding frequency response result can be calculated. Next, in step S134, a result is outputted for the designers. In step S136, based on the outputted result in step S134, the designers determine whether the result meets the required specification. When the result meets the required specifications, the process is finished. If the result does not meet the required specifications, the process will return to step S132 to input parameters again.

Figure 7:
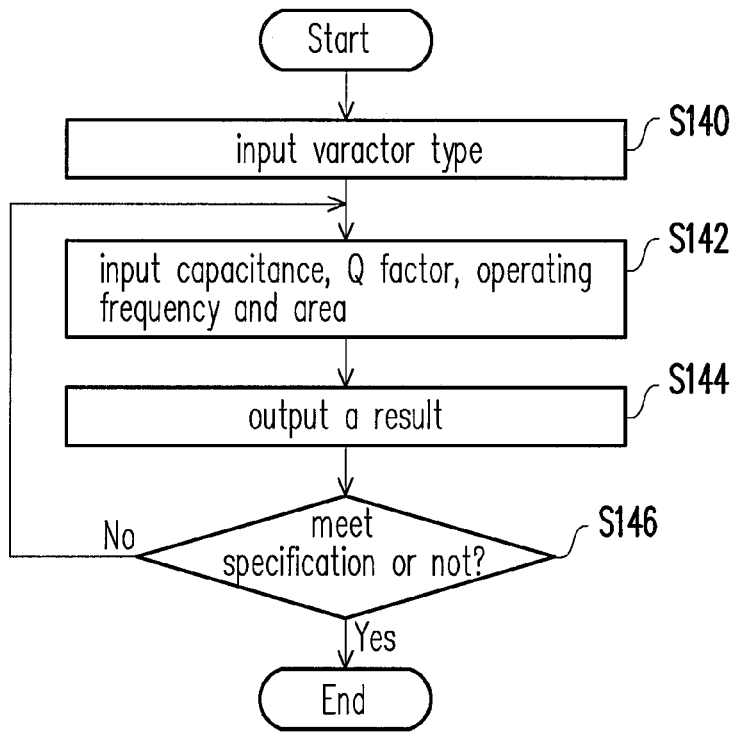
FIG. 7 is a schematic flow chart showing a layout method according to a varactor device as the embodiment of the present invention.

FIG. 7 is a schematic flow chart showing a layout method according to a varactor device as the embodiment of the present invention. A varactor is a variable capacitor whose capacitance can be adjusted. The variable capacitor uses the non-linear dielectric characteristic to dramatically reduce the dielectric constant due to the increase of bias, and can be used for adjusting voltages.

As for the varactor, the steps are similar to the process described above. First, in step S140, type information of the varactor is inputted by designers, such as a N+/N well doped type of a core region and a N+/N well doped type of an input/output region. In step S142, parameters such as a varactor value, a Q factor, an operating frequency and an area limitation are inputted.

In step S144, according to the parameters inputted in the aforesaid two steps, a corresponding frequency response result is calculated and outputted by the system. After the result is obtained by the designers, whether the result satisfies the requirements can be determined. When the result meets the required specification, the process is finished. If the result does not meet the required specifications, the process will return to step S142 to input RF parameters again.

Figure 8:
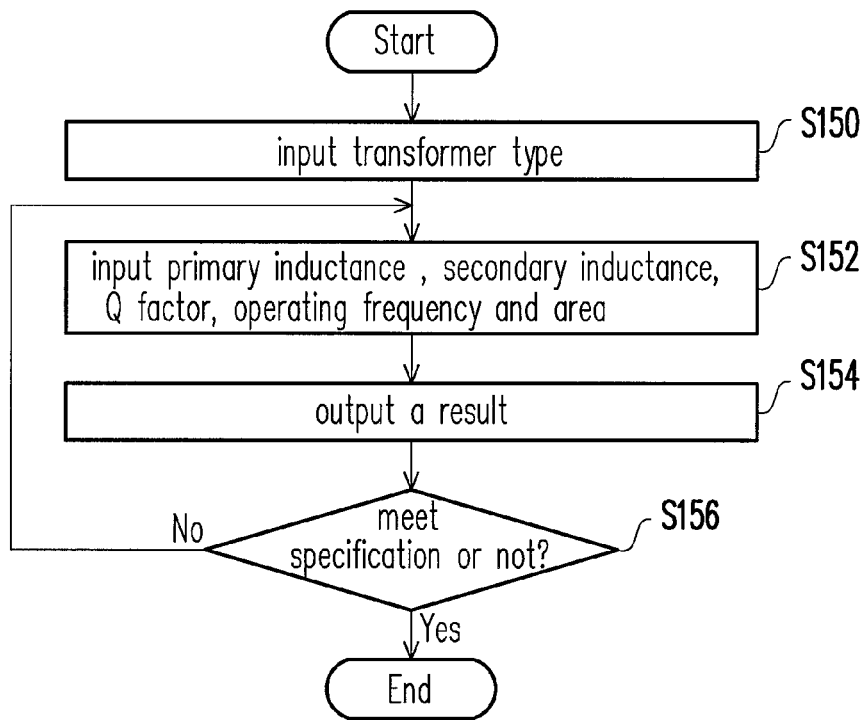
FIG. 8 is a schematic flow chart showing a layout method according to a transformer device as the embodiment of the present invention.
Figure 9:
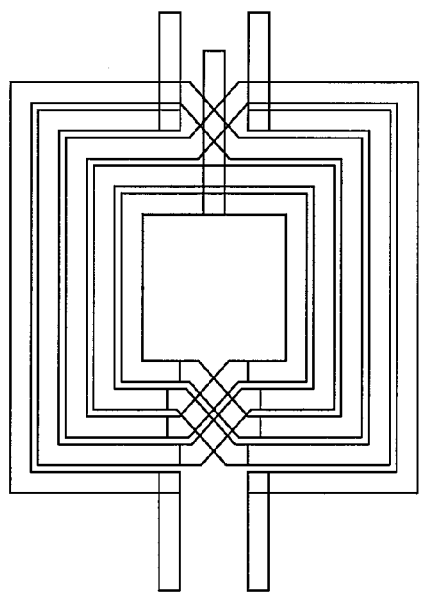
FIG. 9 is an example of FIG. 8, and is a top view of the transformer device.

FIG. 8 is a schematic flow chart showing a layout method according to a transformer device as the embodiment of the present invention. FIG. 9 is an example of FIG. 8, and is a top view of the transformer device. In step S152, designers input type information of the transformer, and then further input RF parameters of the transformer, such as a primary inductance Lp, a secondary inductance Ls, an operating frequency, and a corresponding Q factor (or a ratio of the primary Q factor to the secondary Q factor). The transformer type can be, for example, a turn ratio, an area limitation, an insert loss, and a coupling constant (K), etc. Thus, the system can proceed with calculation based on the inputted type information of the transformer and the RF parameters to obtain a corresponding frequency response result. For example, the inputted parameter can be that inductance Lp/Ls is 2.15 nH/0.9 nH, the Q factor is 7 or more, the operational frequency F is 2.4 GHz, and the transformer is a single-differential type.

The frequency response result can be, for example, the transformer in response to the operating frequency and the Q factor in response to the operating frequency. In addition, the system can also output turns of primary wires and secondary wires, an outer diameter, a width and a pitch between metal layers. Then, in step S154, the frequency response result is outputted for the designers. Accordingly, the designers can determine whether the inputted parameter satisfies the requirements of an IC layout and meets the required specifications.

In step S156, when the outputted result in step S154 meets the required specifications, the aforesaid process is finished. On the other hand, if the outputted result in step S154 does not meet the required specifications, the process will return to step S152 to input new RF parameters and perform the aforesaid process again until a result meeting the required specifications is obtained. For example, above inputted parameters can generate an optimized transformer layer as shown in FIG. 9, in which the optimized output parameters are that the outer diameter is 150 μm, the primary/second turn number is 2/3, the primary/secondary Q factor ratio Qp/Qs is 9.6/8.4, the primary/secondary inductance Lp/Ls is 2.15 nH/0.92 nH, and the turn ratio is 1.53, etc.

In each of the aforementioned embodiments, in order to explain briefly, the individual RF device or a device operated under the RF is taken as an example. However, in practice, the IC layout is not limited only to the single type described above. In IC layout, an RC circuit, an RL circuit, and an RLC circuit are usually included, that is, a circuit configuration in combination of capacitors, inductors, and resistors. The layout method of the present invention can be applied to the combined circuit configuration comprising capacitors, inductors, resistors, and other devices mentioned above.

Besides, the application of the present invention is not limited to the above embodiments, that is, the application is not limited to capacitor, inductor, resistor, and varactor. The layout method of the present invention can be utilized, provided that the layout is applied in the RF range.

Furthermore, descriptions of the above-mentioned embodiments focus on the layout process for the RF device. The method of the present invention can be combined with the general layout method. In other words, all the device parameters (including the RF device and the non-RF device) are inputted in the beginning. Afterwards, the devices are grouped and arranged on a region where an IC layout will be formed. The portion belongs to the conventional art and will not be explained here. It should be emphasized that any layout method can be operated in coordination with the layout method of the RF device of the present invention.

Accordingly, based on the disclosure of the present invention, a preferred device search database concerning the RF device is provided. Therefore, time for designers to design the layout diagram can be reduced. Through inputting the parameters of the RF device such as an operating frequency, a Q factor, and an area limitation, an optimized device dimension and a layout design can be obtained. According to the disclosure of the present invention, designers do not require to perform a testing of a frequency response in the layout process, whereas a simulation is carried out by designers in advance in order to perform the layout process only when the required specifications are satisfied. Therefore, time for designers to design a layout diagram can be reduced.

Further, the invention allows the user to look for the acceptable or even the best layout for the device without actually fabricating the device with the real measurement. A data base has been built, including tremendous amount of solutions of parameters and each of these solutions includes a complete set of parameters comprising later discussed second part and third part parameters. The user can just input some fixed parameters and some rough requirements for some variable parameters. The present invention can then produce the full set of the variable parameters for the layout of the device. The output of the complete set of variable parameters can be checked by the user. Depending on what the device is to be concerned for the layout, the parameter table for input can be divided into three parts, in which the first part is about some fixed parameters for the device type to have layout being searched based on the data base. The first part of fixed parameter includes, for example, the number of metal stack, the intended fabrication processes, and so on, relating to the fixed choice for the device type in structure and fabrication. The second part and the third part are variable parameters, in which some of the parameters can be input by the user and then a complete table can be obtained. The second part of variable parameters, as for example shown in Table 1 for a capacitor, is the option parameters, including the ranges and the intended property. The third part of the variable parameters is related to the actual layout parameters, as for example shown in Table 2 for a capacitor. Usually, at least some of the second part of variable parameters is input by the user, and then the rest parameters of the second part and the third part of the variable parameters can be filled out by the method according to the database in search. Or, at least some of the third part of variable parameters is input by the user, and then the second part and the rest of the third part of parameters can be filled out by the method according to the database in search. It may also include a selection for the optimized choice. However, the user can input any parameter in the second part and the third part as the desired quantity. It can also be noted that the result of the variable parameters as the solution in search for the layout may be different from the original input from the user.

TABLE 1

Min. bm
Freq
C/Q
Length/Width
Max. ns
Max. finger_I
Max. nf
Max. array size

TABLE 2 bm
ns
Finger_I
Nf
Array size
C/Q
Freq.

The parameters in Table 1 are belonging to the parameters of layout in the desired range. Table 2 is the solution of the parameters of the layout of the device type. The parameters in Table 1 are just the examples and are the layout to be searched by the user. For example, the parameter bm is the number m of the bottom metal layer of the device starting from in the metal stack. In this example, the parameter freq is the desired operation frequency. The parameter C/Q is the intended C/Q value. The parameter length/width is the length and width. The parameter Finger_I is a number of fingers of the metal layer.

Figure 10:
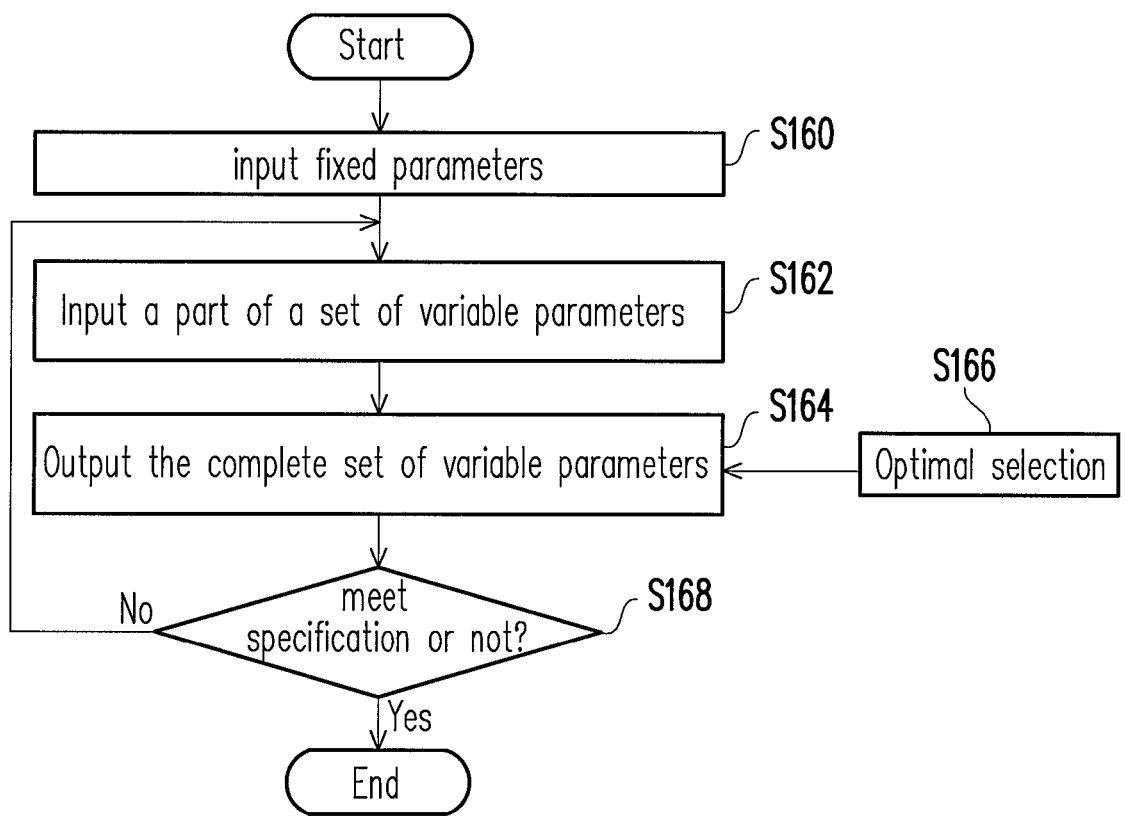
FIG. 10 is a schematic flow chart showing a layout method according to an inductor device as the embodiment of the present invention.

Based on the above operation mechanism, the method can be further described in a step flow chart. FIG. 10 is a schematic flow chart showing a layout method according to an inductor device as the embodiment of the present invention. In FIG. 10, after the process starts, in step S160, the fixed parameters relating to the device type are input. In step S162, a part of a set of variable parameters is input by the user. Here, the complete set of the variable parameters, as previously described, includes the parameters in Table 1 and Table 2 in two parts. In step S164, the complete set of the variable parameters are output based on the solutions in the database. For an additional choice, in step S166, and optimal selection can be used to have the optimized solution for the layout under the input criteria if multiple complete sets of variable parameters are output. In step 168, the output of the parameter of layout is checked by user or an automatic check with the set quantity in S160. However, if the layout does not meet the specification then, the process goes back to the step S162 to search another solution. Otherwise, the process goes to an end. It can be noted that the step S168 can automatically check for some situation. For example, if the operation frequency is to be checked, then the frequency in table 2 can be automatically checked with the frequency in Table 1 until the frequency range is met. Then, the complete set of layout can be output to the user.

It can be noted that the foregoing embodiments can be generally applied in FIG. 10. The invention has built the database with the solutions for the chosen parameters by the user. The layout is not necessary to be actually made with actually measurement. However, the actually layout may be verified with actual fabrication with actually measurement, based on a little modification or no modification on the layout in solution.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A system for producing a layout of a device in an integrated circuit before actually fabricated, the system proceeding:
    receiving at least one fixed parameter for the device for fabrication;
    receiving a first part of a set of variable parameters of a layout of the device;
    the system outputting the complete set of the variable parameters, wherein a database has already been built for searching by the system to get a solution of the complete set of the variable parameters corresponding to the at least one fixed parameters and the first part of the set of variable parameters by the system; and
    checking whether or not the layout with the complete set of the variable parameters is satisfying a requirement, wherein an end step is reached if the layout is accepted by the requirement, and a new part of the set of variable parameters as the first part being looping in the foregoing steps if the layout is not accepted by the requirement.

2. The system of claim 1, wherein the step in checking whether or not the layout with the complete set of the variable parameters is satisfying the requirement comprises automatically checking an operation frequency.

3. The system of claim 1, wherein the step of inputting the first part of the set of variable parameters comprises input a requirement of obtaining an optimal set of the layout.

4. The system of claim 1, wherein the fixed parameter for the device is about fabrication process for capacitor, an RF device, a stacked type of metal layers.

5. The system of claim 1, wherein the part of the set of the variable parameters comprises a number of the stacked type, a number of fingers of the metal layer, and a length and a width of the finger.

6. The system of claim 1, wherein the part of the set of the variable parameters comprises at least one of a geometrical shape, a geometric dimension, a symmetric relation.

7. The system of claim 1, wherein the device comprises a capacitor device, an inductor device, a varactor device, a resistor device, a transistor, a transformer or a combination thereof.

* * * * *